(12) United States Patent
Jiang et al.

(10) Patent No.: US 9,127,934 B2
(45) Date of Patent: Sep. 8, 2015

(54) SPACE IMAGING OVERLAY INSPECTION METHOD AND ARRAY SUBSTRATE

(71) Applicant: BEIJING BOE OPTOELECTRONICS TECHNOLOGY CO., LTD., Beijing (CN)

(72) Inventors: Xiaohui Jiang, Beijing (CN); Jian Guo, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 174 days.

(21) Appl. No.: 13/704,678

(22) PCT Filed: Nov. 8, 2012

(86) PCT No.: PCT/CN2012/084342
§ 371 (c)(1),
(2) Date: Dec. 17, 2012

(87) PCT Pub. No.: WO2013/086913
PCT Pub. Date: Jun. 20, 2013

(65) Prior Publication Data
US 2014/0055795 A1    Feb. 27, 2014

(30) Foreign Application Priority Data

Dec. 12, 2011 (CN) .......................... 2011 1 0412502
Feb. 6, 2012 (CN) .......................... 2012 1 0025005

(51) Int. Cl.
G01B 11/14 (2006.01)
G03F 7/20 (2006.01)
G03F 9/00 (2006.01)

(52) U.S. Cl.
CPC ............ *G01B 11/14* (2013.01); *G03F 7/70633* (2013.01); *G03F 9/00* (2013.01); *G03F 9/708* (2013.01); *H01L 2924/0002* (2013.01)

(58) Field of Classification Search
CPC ...... G01B 11/14; G03F 7/70633; G03F 9/708
See application file for complete search history.

(56) References Cited

U.S. PATENT DOCUMENTS 4,677,043 A * 6/1987 Cordes et al. .................. 430/22
6,239,856 B1    5/2001 Imura et al.
(Continued)

FOREIGN PATENT DOCUMENTS

CN    1234523 A    11/1999
CN    1731281 A    2/2006
(Continued)

OTHER PUBLICATIONS

First Chinese Office Action dated Jul. 16, 2013, Appln. No. 201210025005.0.
(Continued)

*Primary Examiner* — Gordon J Stock, Jr.
(74) *Attorney, Agent, or Firm* — Ladas & Parry LLP

(57) ABSTRACT

Embodiments of the invention discloses a space imaging overlay inspection method and an array substrate; the method comprises: forming a thin film having a space imaging overlay mark by photolithography; when the thin film is a transparent thin film, performing a color developing treatment on the space imaging overlay mark on the transparent thin film, so as to make the space imaging overlay mark appear in a non-transparent color; and conducting a space imaging overlay inspection between the transparent thin film and an adjacent thin film by using the space imaging overlay mark appear appearing in the non-transparent color. In the method, by conducting the color developing treatment to the space imaging overlay mark on the transparent thin film and then conducting positioning, the space imaging overlay mark can be positioned quickly and accurately, thus alignment condition between two photolithography procedures can be detected swiftly and effectively.

6 Claims, 2 Drawing Sheets

(56) References Cited

U.S. PATENT DOCUMENTS

| | | |
|---|---|---|
| 6,468,704 B1 | 10/2002 | Liao et al. |
| 8,513,822 B1 * | 8/2013 | Ghinovker .................... 257/797 |
| 2005/0078246 A1 | 4/2005 | Yoo et al. |
| 2007/0177244 A1 | 8/2007 | Jang et al. |
| 2008/0289754 A1 | 11/2008 | Sone et al. |
| 2009/0009672 A1 | 1/2009 | Chung et al. |
| 2012/0146159 A1 * | 6/2012 | Wang et al. .................... 257/410 |

FOREIGN PATENT DOCUMENTS

| | | | |
|---|---|---|---|
| CN | 101075054 A | | 11/2007 |
| CN | 101312156 A | | 11/2008 |
| CN | 101013197 B | | 4/2010 |
| CN | 102636962 A | | 8/2012 |
| EP | 0 709 735 A2 | | 5/1996 |
| JP | 10-163588 A | | 6/1998 |
| JP | 2011-248207 A | | 12/2011 |
| KR | 2003054069 A | * | 7/2003 |

OTHER PUBLICATIONS

International Search Report; mailed Feb. 28, 2013; Appln. No. PCT/CN2012/084342.

International Preliminary Report on Patentability dated Jun. 17, 2014; PCT/CN2012/084342.

* cited by examiner

SPACE IMAGING OVERLAY INSPECTION METHOD AND ARRAY SUBSTRATE

TECHNICAL FIELD

Embodiments of the present invention relate to a space imaging overlay inspection method and an array substrate.

BACKGROUND

An ADvanced Super Dimension Switch technology (ADS) is a wide-viewing angle technology, which has been proposed for liquid crystal televisions and tabletop displays of large-size and high-resolution in the liquid crystal field at present. Because it possesses advantages of wide viewing angle, high aperture ratio, low power consumption, high luminance, and so on, its application is becoming more and more widespread. In this technology, a multi-dimensional electric field is formed by an electric field produced at edges of slit electrodes on the same plane and an electric field produced between a slit electrode layer and a plate-like electrode layer, so as to allow liquid crystal molecules at all orientations in a liquid crystal cell, which are located directly above the electrode and between the slit electrodes, to be rotated, thereby enhancing the work efficiency of liquid crystals and increasing transmissive efficiency. The Advanced Super Dimensional Switch technology can improve the picture quality of TFT products, and has advantages of high resolution, high transmittance, low power consumption, wide viewing angle, high aperture ratio, low chromatic aberration, and push Mura-free, etc.

In a current process for manufacturing an array substrate of a thin film transistor liquid crystal display (TFT-LCD), a plurality of photolithography procedures are used to perform patterning for thin film layers so as to form a plurality of thin film (pattern) layers. For ensuring exactness of each of the photolithography procedures, it is necessary to make sure the alignment accuracy among the plurality of photolithography procedures by space imaging overlay inspections. Generally, in an overlay inspection, an overlay mark on a photomask is used to form an overlay mark pattern in the thin film layer formed by photolithography, and by means of checking a shift between overlay mark patterns on adjacent thin film layers, alignment condition between two photolithograph procedures can be effectively detected. Thus, precise alignment of the overlay mark patterns on two adjacent thin film layers is the key to ensure accuracy of the overlay inspection.

With a current process for manufacturing an array substrate of an ADS mode TFT-LCD as an example, a layer of indium tin oxides (ITO) conductive film is formed on a glass substrate in a first photolithography, and a layer of metal gate thin film is further formed on a surface of the layer of the ITO thin film in a second photolithography. However, the ITO thin film is a transparent conductive thin film, and before an overlay inspection between the gate thin film layer and the ITO thin film layer is conducted, photoresist on the surface of the ITO thin film layer (photoresist is usually non-transparent, and an overlay mark pattern on it is relatively clear) has already been removed, and therefore, when the overlay inspection is conducted between the gate thin film layer and the ITO thin film layer, transparency of the ITO thin film layer often results in such a case that an overlay mark pattern on the ITO thin film layer cannot be positioned accurately, and accordingly time consumption for the overlay inspection is longer.

SUMMARY

Embodiments of the present invention provide a space imaging overlay inspection method and an array substrate, for solving the problem in an existing space imaging overlay inspection technology that space imaging overlay marks cannot be positioned quickly and accurately because the thin film formed by photolithography is a transparent thin film.

In one aspect of the present invention, there is provided a space image over inspection method, comprising: forming a thin film having a space imaging overlay mark by photolithography; when the thin film is a transparent thin film, performing a color developing treatment on the space imaging overlay mark on the transparent thin film, so as to make the space imaging overlay mark appear in a non-transparent color; and conducting a space imaging overlay inspection between the transparent thin film and an adjacent thin film by using the space imaging overlay mark appear appearing in the non-transparent color.

As to the method, for example, performing of the color developing treatment on the space imaging overlay mark on the transparent thin film so as to make the space imaging overlay mark appear in a non-transparent color comprises: ejecting gas to a region where the space imaging overlay mark on the transparent thin film is located in an environment subject to a vacuum treatment, wherein the gas is capable of conducting a haze reaction with the space imaging overlay mark, so that the space imaging overlay mark subject to the haze reaction appears in the non-transparent color.

As to the method, for example, performing of the color developing treatment on the space imaging overlay mark on the transparent thin film so as to make the space imaging overlay mark appear in a non-transparent color comprises: ejecting a dye to a region where the space imaging overlay mark on the transparent thin film is located, so as to make the space imaging overlay mark appear in the non-transparent color.

As to the method, for example, the transparent thin film is an indium tin oxide (ITO) transparent thin film.

As to the method, for example, the ITO transparent thin film is formed by a photolithography process, and the space imaging overlay mark is located in a non-display area of the ITO transparent thin film.

As to the method, for example, performing of the color developing treatment on the space imaging overlay mark on the transparent thin film so as to make the space imaging overlay mark appear in a non-transparent color specifically comprises: ejecting gas to a region where the space imaging overlay mark on the transparent thin film is located in an environment subject to a vacuum treatment, so as to make the space imaging overlay mark appear in the non-transparent color, wherein the gas is ammonia gas ($NH_3$ gas) and silicane ($SiH_4$) gas.

As to the method, for example, the vacuum treatment is to fill nitrogen gas ($N_2$) into the environment, and a ratio of the filled $N_2$ gas to the ejected $NH_3$ gas and $SiH_4$ gas is:

$$NH_3:SiH_4:N_2=1550 \text{ sccm}:4000 \text{ sccm}:14400 \text{ sccm}$$

wherein sccm (standard-state cubic centimeter per minute) is a unit of volume flow rate.

As to the method, for example, the $NH_3$ gas ejected to the region where the space imaging overlay mark on the transparent thin film is located is fully involved in the reaction, and the amount of the ejected SiH4 gas is excessive.

As to the method, for example, it further comprises: when the thin film is a non-transparent thin film, a space imaging overlay inspection between the transparent thin film and an adjacent thin film is conducted by utilizing the space imaging overlay mark of the non-transparent thin film.

In another aspect of the invention, there is further provided an array substrate, the array substrate comprising at least one of transparent thin film with a space imaging overlay mark, and the space imaging overlay mark on the transparent thin film appearing in a non-transparent color.

As to the array substrate, for example, the transparent thin film is an indium tin oxide (ITO) transparent thin film.

Embodiments of the invention provide a space imaging overlay inspection method and an array substrate, in which by means of conducting the color developing treatment onto the space imaging overlay mark on the transparent thin film and then conducting positioning, the problem is resolved in an existing photolithography process that, when a thin film formed by photolithography is a transparent thin film, transparency of the thin film results in such a case that a space imaging overlay mark cannot be positioned accurately and conveniently by an apparatus for space imaging overlay detections.

BRIEF DESCRIPTION OF THE DRAWINGS

To illustrate technical solutions in embodiments of the present invention more clearly, accompanied drawings of the embodiments will be briefly introduced below. Obviously, the accompanied drawings described below merely relate to some embodiments of the present invention, and are not limitation on the present invention.

DETAILED DESCRIPTION

Figure 1:
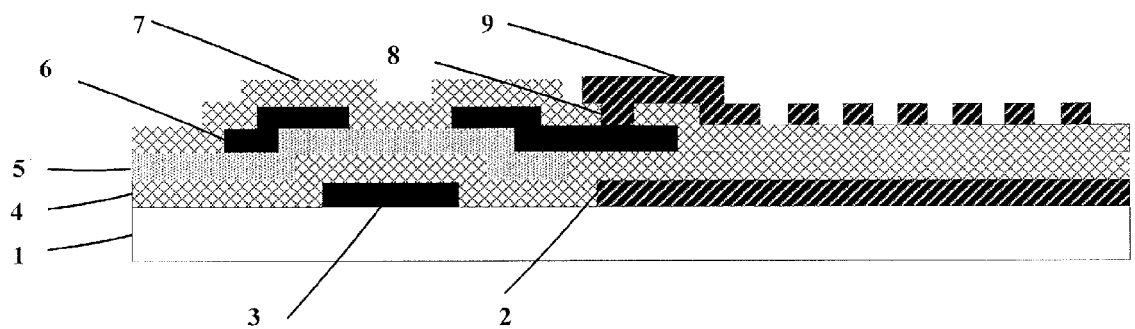
FIG. 1 is a structurally schematic view illustrating an array substrate formed through respective photolithograph procedures in an embodiment of the invention.

In order to make objects, technical details and advantages of the embodiments of the invention apparent, hereinafter, technical solutions in embodiments of the present invention will be clearly and fully described in combination with the accompanied drawings in the embodiments of the present invention. Apparently, the embodiments to be described are merely a part but not all of embodiments of the present invention. Every other embodiment as would be obvious to those ordinarily skilled in the art on the basis of described embodiments in the present invention without creative work, comes within the protection scope of the present invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

According to an embodiment of the present invention, there is provided a space imaging overlay inspection method, which is directed to solve the problem present in a process for a TFT-LCD array substrate that, when a transparent thin film after photolithography is positioned, due to a transparent characteristic of the transparent thin film, an apparatus for positioning-detection cannot carry out positioning accurately and conveniently, and especially to solve the problem that in alignment detections of a plurality of transparent thin films, positioning cannot be conducted accurately and quickly when space imaging overlay marks on the thin films are used as references, and this will directly adversely affect result and efficiency of the alignment detections. The method of the embodiment comprises the following steps.

Step 101, a layer of thin film with a space imaging overlay mark is formed by photolithography.

In a process of manufacturing an array substrate of an ADS mode TFT-LCD, it is possible that a structure of multi-layered thin film (pattern) will be formed by a plurality of photolithography processes; and as to a thin film necessary to be aligned with an adjacent film layer, an overlay mark will be formed on the thin film by a corresponding photolithography process.

The thin film may be a first layer of thin films obtained by photolithography process, and may also be another layer of the thin films, which is formed over the first layer of the thin films.

Step 102, when the thin film is a transparent thin film, a color developing treatment is conducted on the overlay mark on the transparent film thin film, so as to make the overlay mark appear in a nontransparent color.

If it is a transparent thin film, the overlay mark is not easy to be spotted out. Thus, for the sake of detection-positioning convenience, the color developing treatment is conducted on the transparent thin film in the embodiment of invention, so that the overlay mark can be detected quickly to conduct subsequent overlay detections.

Various exemplary manners of the color developing treatment can be used, and any treatment manner which is suitable to be implemented in the semiconductor process and does not affect other process flows is preferably adopted.

Step 103, a space imaging overlay inspection between the transparent thin film and an adjacent thin film is carried out by utilizing the space imaging overlay mark in the nontransparent color.

The used overlay inspection procedure may, for example, adopt an existing manner in prior art, details being omitted here.

According to the embodiment of the invention, by means of conducting the color developing treatment onto the space imaging overlay mark on the transparent thin film and then conducting positioning, the problem in an existing photolithography process that, when a thin film formed by photolithography is a transparent thin film, transparency of the thin film results in such a case that a space imaging overlay mark cannot be positioned accurately and conveniently by an apparatus for overlay detections, is solved.

For example, the aforesaid thin film adjacent to the transparent thin film is nontransparent, and there is a space imaging overlay mark on the adjacent thin film. Of course, the adjacent thin film may also be a transparent thin film, but its overlay mark is not subject to a color developing treatment.

An example of the color developing treatment given to the overlay mark on the transparent thin film will be described as below.

In an environment subject to a vacuum treatment, a kind of gas is ejected to a region where the overlay mark on the transparent thin film is located, and the gas can create a haze reaction with the overlay mark, so that the overlay mark subject to the haze reaction is shown in a nontransparent color. The haze reaction here means that the gas undergoes a chemical reaction with the transparent thin film to thereby make it shown in non-transparency. Generally, a new substance can be generated by the chemical reaction, and thus the reaction region will be made to be shown in the nontransparent color. Upon ejection, an ejecting device with which the ejection is implemented conveniently on the overlay mark can be selected. This manner is a gas ejecting manner, and the gas may be selected from any gas which is capable of conducting a chemical reaction with the transparent thin film and thus make it changed in color, in accordance with the material of the transparent thin film.

Another example of the color developing treatment conducted on the overlay mark on the transparent thin film will be described as below.

A dye is ejected to a region where the overlay mark on the transparent thin film is located, so that the space imaging overlay mark is shown in a nontransparent color. The ejected dye may be selected from any dye which is prone to be attached to the transparent thin film, in accordance with the material of the transparent thin film; and the color of the dye may also be selected according to specific requirements. This manner is a liquid ejecting manner.

For example, the aforesaid transparent thin film is an indium tin oxide (ITO) transparent thin film. Obviously, it may also be a transparent thin film using another material, such as Indium Zinc Oxide (IZO), Tin Oxide ($SnO_2$), etc.

For example, the ITO transparent thin film is patterned by a photolithography process in the course of manufacturing an ADS mode array substrate so as to form a desired pattern, and the image of the space imaging overlay mark is located in a non-display area of the ITO transparent thin film.

According to an embodiment of the invention, there is further provided an array substrate. The array substrate comprises at least one layer of transparent thin film with a space imaging overlay mark thereon, the space imaging overlay mark on the transparent thin film is shown in a nontransparent color. For example, the space imaging overlay mark may be treated by using the method in the aforesaid embodiment to appear in a nontransparent color. For example, the transparent thin film is an indium tin oxide (ITO) transparent thin film.

Hereinafter, with an ITO transparent thin film as an example, a preferable embodiment of the space imaging overlay inspection method of the invention will be given. The method of the embodiment comprises the following steps.

Step 201, in a process of manufacturing an array substrate of an ADS mode TFT-LCD, a first photolithograph procedure is carried out firstly, and a layer of transparent, ITO semiconductor conductive thin film is formed on for example a glass substrate.

The ITO thin film layer will function as a common electrode, and an overlay mark is contained in a non-display area on the ITO thin film layer.

For the purpose that a second photolithography procedure can be performed on the premise that the ITO thin film is positioned accurately, before a metal gate thin film layer is formed by the second photolithography procedure, the following steps are carried out.

Step 202, the above substrate with the ITO thin film is placed in a vacuum environment suitable for gas ejection onto overlay marks.

For example, a closed groove chamber is collected in front of a transfer groove of a sputter. Nitrogen gas is filled into the closed groove chamber to maintain sputtering atmosphere, and a vacuum environment is formed therein with a negative pressure compared with the Atmosphere. The size of the closed groove chamber is enough to accommodate the substrate. One nozzle or a plurality of movable nozzles are installed in the closed groove chamber, and the direction of the nozzle(s) can be adjusted; the substrate, the surface of which is covered by the ITO thin film, is carried from the transfer groove into the closed groove chamber; and the direction of the nozzle(s) is adjusted to be aligned with the overlay mark pattern in the non-display area on the ITO thin film.

Step 203, ammonia gas ($NH_3$ gas) and silicane ($SiH_4$) gas are ejected to a region where the overlay mark pattern is located by the nozzle(s). For example, the ratio of the ejected $NH_3$ gas and $SiH_4$ gas ($SiH_4$ gas is not excessive at this time) to $N_2$ gas filled for the purpose of maintaining the vacuum environment is:

$$NH_3:SiH_4:N_2=1550 \text{ sccm}:4000 \text{ sccm}:14400 \text{ sccm}$$

In the above formula, seem (standard-state cubic centimeter per minute) is a unit of volume flow rate.

In the aforesaid process, $NH_3$ functions as a source of nitrogen, $SiH_4$ functions as a source of silicon, and these two kinds of gas react on the surface of the ITO thin film to generate $SiN_3$.

Step 204, through the nozzle(s), $SiH_4$ gas is ejected to the region where the overlay mark pattern is located continually until the amount of the $SiH_4$ gas is excessive.

It is necessary that $SiH_4$ gas be continually ejected until it is excessive in this process to promote the reaction between the ITO and $SiN_3$, so that a haze phenomenon occurs at the surface of the ITO region where the overlay mark pattern is located, and its color is deepened and blackened.

Step 205, gas ejection of the nozzle(s) stops, and the substrate is carried from the closed groove chamber back to the transfer groove of the sputter.

Step 206, based on the overlay mark subject to the color developing treatment on the ITO, an overlay inspection between the ITO and a thin film layer formed by photolithography later is conducted.

After the above operational steps, the second photolithography procedure for forming the metal gate layer, a third photolithography procedure for forming a gate insulating layer, an active layer, and source-drain metal electrodes, a fourth photolithography procedure for forming an via hole, and a fifth photolithography procedure for forming another ITO thin film layer functioning as a pixel electrode are further performed on the substrate. Up to here, fabrication of the array substrate is completed.

What is shown in FIG. 1 is a structurally schematic view showing the array substrate formed through the individual photolithograph procedures, and the formed array substrate comprises: a glass substrate 1 and an ITO common electrode 2, a metal gate layer 3, a gate insulating layer 4, an active layer 5, source-drain metal electrodes 6, a passivation layer 7, a via hole 8 and an ITO pixel electrode 9 which are formed above the glass substrate 1. Specifically, the gate insulating layer 4 covers the ITO common electrode 2 and the metal gate layer 3; the active layer 5 takes the form of such as an island and is formed on the gate insulating layer 4; two source-drain metal electrodes 6 are formed on two sides of the active layer 5 and opposed to each other; the passivation layer 7, in which the via hole 8 for exposing a part of one of the source-drain metal electrodes 6 is formed, covers the active layer 5 and the source-drain metal electrodes 6; and the ITO pixel electrode 9 is formed on the passivation layer 7 and is electrically connected to corresponding one of the source-drain metal electrodes 6 through the via hole 8.

The array substrate according to the embodiment of the invention comprises a plurality of gate lines (not shown) and a plurality of data lines (not shown), and these gate lines and data lines intersect each other to thereby define pixel units arranged in a matrix form. Each of the pixel units comprises a thin film transistor functioning as a switch element and a pixel electrode and a common electrode which are used to control orientation of liquid crystals. For example, for the thin film transistor of each pixel, its gate electrode is electrically connected to or integrally formed with a corresponding gate line, its source electrode is electrically connected to or integrally formed with a corresponding data line, and its drain electrode is electrically connected to or integrally formed with a corresponding pixel electrode. A schematically cross-sectional view of single pixel unit is shown in FIG. 1. The array comprises a display area for displaying and a non-display area located on the periphery of the display area.

The glass substrate 1 is an example of the base substrate, and a plastic or quartz substrate and so on may also be used for the base substrate. The active layer 5, for example, may adopt amorphous silicon or other semiconductor material.

In the embodiment of the invention, a region of the overlay mark pattern on the ITO thin film layer formed by the first photolithography is no long transparent, but is colored, and therefore, after the second photolithography procedure is carried out and an overlay inspection is conducted, the overlay mark pattern can be recognized by a critical-dimension scanning electron microscope (CD-SEM) apparatus easily and clearly. Thus, speed of the overlay inspection is increased, and accuracy of the overlay inspection is enhanced. Furthermore, the ejection angle, ejection speed of nozzle(s) and the environmental temperature are determined by an actual operational environment (for example, ejection angle is controlled as between 45 degree and 60 degree, and environmental temperature as between 250□ and 300□), whereby it is possible that the chemical reaction occurring in the color developing treatment is only in the non-display area of the surface of the ITO thin film layer, and will not bring an effect on the display area. Thus, the color developing treatment conducted on the overlay mark pattern is secure and feasible, and for example, can be suitable for the process of manufacturing an ADS mode TFT-LCD array substrate, but is not limited to ADS mode.

Figure 2:
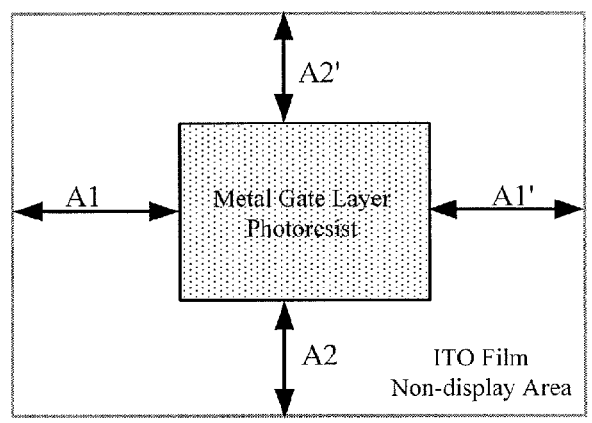
FIG. 2 is a schematic view illustrating an overlay inspection in the embodiment of the invention.

What is shown in FIG. 2 is a schematic view illustrating an overlay inspection in the embodiment, and in this case, the overlay mark on the ITO thin film formed by the first photolithography procedure is the entire non-display area. In this way, a process of conducting the overlay inspection between the ITO thin film and the metal gate layer before the photoresist PR on the metal gate layer which is formed by the second photolithography procedure is removed, is as follows: length values A1, length values A1', length values A2 and length values A2' on the metal gate layer and the ITO thin film are measured, respectively; next, difference of length values A1, difference of length values A1', difference of length values A2, and difference of length values A2' regarding the two thin film layers are checked, and the smaller these differences are, the higher the alignment accuracy between the two photolithography procedures are, and otherwise, the accuracy is lower.

Figure 3:
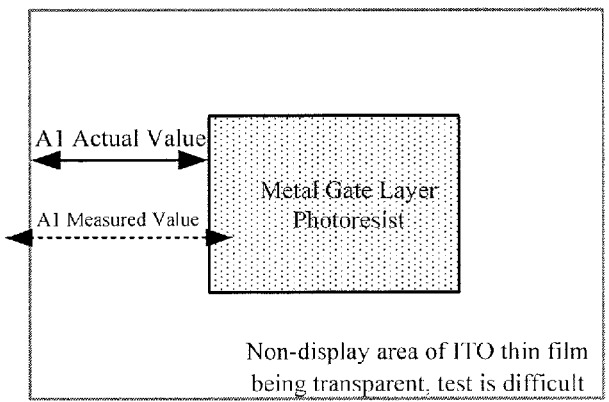
FIG. 3 is a schematic view illustrating an overlay inspection when no color developing treatment is carried out according to an embodiment of the invention.

What is shown in FIG. 3 is a schematic view illustrating an overlay inspection in which no color developing treatment is conducted on the ITO thin film formed by the first photolithography. In this case, due to transparency of the non-display area at the boundary of the ITO thin film, boundaries of the A1 cannot be positioned accurately, so that the length values A1 cannot be measured accurately. For example, the A1 obtained by measurement (denoted by a broken-line arrow in the figure) is made to be larger than an actual value (denoted by a solid-line arrow in the figure), and there may also be errors in the A1', A2 and A2' which are obtained by measurement likewise. As such, the conducted overlay inspection will be inaccurate.

Figure 4:
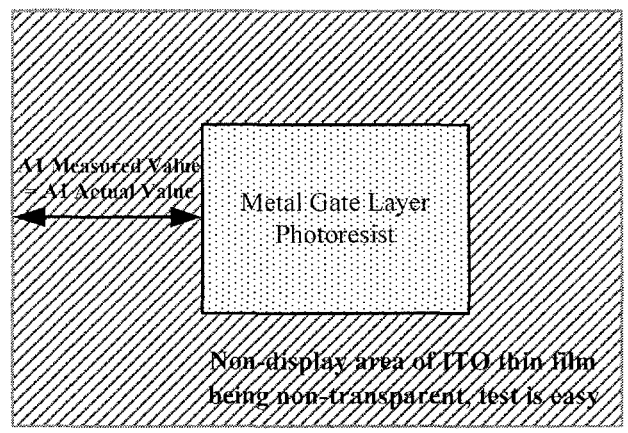
FIG. 4 is a schematic view illustrating an overlay inspection when a color developing treatment is carried out according to an embodiment of the invention.

What is shown in FIG. 4 is a schematic view illustrating an overlay inspection in which a color developing treatment is conducted on the ITO thin film formed by the first photolithography. In this case, through the color developing treatment, the non-display area of the ITO thin film layer is subject to a haze treatment and its color is deepened, so the boundaries of the A1 can be positioned conveniently and the length values A1 obtained by measurement are accurate. Likewise, length values A1', A2 and A2' which are obtained by measurement can be accurate, to thereby ensure accuracy of the overlay inspection.

The main reason of carrying out the color developing treatment in the manufacture process of the substrate is that, the overlay mark can be spotted out conveniently when an overlay inspection following the second photolithography is conducted, whereby the overlay mark on the ITO thin film layer formed by the first photolithography can be used as a reference. Furthermore, because the metal gate layer formed by the second photolithography is not transparent, upon each of subsequent overlay inspections, an overlay mark on the metal gate layer can be used as a reference. Meanwhile, the thin film layers formed by the second photolithography through the fourth photolithography are all film layers possessing non-transparency, so the pattern of the overlay mark can be discerned by the CD-SEM apparatus easily, and it is unnecessary to use the above color developing process.

However, it should be noted that, a color developing process may not be used for the ITO thin film layer formed by the fifth lithography in the manufacturing process of the ADS mode array substrate. The reason is that, the ITO thin film layer formed through the fifth photolithography is the last layer of photolithography thin films of the substrate, and therefore, it is possible that an overlay inspection is conducted on the ITO thin film layer and a preceding thin film layer before the photoresist on a surface of the ITO thin film layer has not been removed yet. As such, due to non-transparency of the photoresist, an overlay mark image on the surface of the photoresist can be spotted out by the CD-SEM apparatus easily. Thus, it is not suggested to give a color developing treatment to an overlay mark image on the lastly formed ITO thin film, to thereby omit unnecessary troubles.

The process of the color developing treatment in the embodiment needs to be performed in an environment subject to a vacuum treatment, and preferably, a manner of filling nitrogen gas ($N_2$) into a closed environment is conducted for the vacuum treatment.

In addition to the above manner, many other manners may also be used for the color developing treatment conducted on the overlay mark pattern in the embodiment. There is no specific limitation on the used manner for the color developing treatment which is conducted on transparent images in embodiments of the invention, only if the overlay mark pattern can be made to be shown in a non-transparent color and the normal function of the ITO thin film layer in such as the array substrate of the ADS mode TFT-LCD is not affected, and all such cases fall within the protection scope of the invention. For example, such a manner that a dye is ejected to a region where the overlay mark pattern on the transparent ITO thin film layer is located may also be used, so as to make it shown in a non-transparent color.

In the above embodiments, explanation of the method for conducting overlay inspections on transparent thin films provided by the invention has been made only by using an array substrate of an ADS mode TFT-LCD an example. Obviously, the above scheme can also be applied to other TFT-LCD structures, such as, an array substrate of a TFT-LCD of a TN type, IPS type or the like, or a color filter substrate containing a transparent film layer.

According to an embodiment of the invention, there is further provided an array substrate. The array substrate comprises at least one layer of transparent thin film with space imaging overlay mark, and the space imaging overlay mark on the transparent thin film(s) is/are shown in a non-transparent color.

For example, the transparent thin film is an indium tin oxide (ITO) transparent thin film.

Obviously, various modifications and variances can be made by those skilled in the art without departing from the spirit and scope of the present invention. Thus, provided that these modifications and variances come within the scope of claims of the present invention and the equivalent technologies thereof, these modifications and variances are also intended to be embraced within the present invention.

The invention claimed is:

1. A space imaging overlay inspection method, comprising:

forming a thin film having a space imaging overlay mark by photolithography; the thin film being a transparent thin film, performing a color developing treatment on the space imaging overlay mark on the transparent thin film, so as to make the space imaging overlay mark appear in a non-transparent color, by ejecting gas to a region where the space imaging overlay mark on the transparent thin film is located in an environment subject to a vacuum treatment, wherein the gas is capable of conducting a haze reaction with the space imaging overlay mark, so that the space imaging overlay mark subject to the haze reaction appears in the non-transparent color; and conducting a space imaging overlay inspection between the transparent thin film and an adjacent thin film by using the space imaging overlay mark appearing in the non-transparent color.

2. The method claimed as claim 1, wherein the transparent thin film is an indium tin oxide (ITO) transparent thin film.

3. The method claimed as claim 2, wherein the ITO transparent thin film is patterned by a photolithography process, and the space imaging overlay mark is located in a non-display area of the ITO transparent thin film.

4. The method claimed as claim 3, wherein the gas is ammonia gas ($NH_3$ gas) and silicane ($SiH_4$) gas.

5. The method claimed as claim 4, wherein the vacuum treatment is to fill nitrogen gas ($N_2$) into the environment, and a ratio of the filled ($N_2$) gas to ejected the $NH_3$ gas and $SiH_4$ gas is: $NH_3$:$SiH_4$:$N_2$=1550 sccm:4000 sccm:14400 sccm.

6. The method claimed as claim 4, wherein all of the $NH_3$ gas ejected to the region where the space imaging overlay mark on the transparent thin film is located is fully involved in the reaction, and the amount of the ejected $SiH_4$ gas is larger than the amount for reacting with the all of the $NH_3$ gas ejected to the region where the space imaging overlay mark on the transparent thin film is located.

\* \* \* \* \*